United States Patent [19]

Cann

[11] Patent Number: 4,585,960
[45] Date of Patent: Apr. 29, 1986

[54] PULSE WIDTH TO VOLTAGE CONVERTER CIRCUIT

[75] Inventor: Alfred J. Cann, Wilton, N.H.

[73] Assignee: Sanders Associates, Inc., Nashua, N.H.

[21] Appl. No.: 659,808

[22] Filed: Oct. 11, 1984

[51] Int. Cl.<sup>4</sup> ............................ G06G 7/12; H03K 5/08
[52] U.S. Cl. ...................................... 307/490; 307/549; 307/555; 307/561; 328/127
[58] Field of Search ................ 307/490, 549, 551, 561, 307/565, 540, 42, 55, 56; 328/127, 128

[56] References Cited

U.S. PATENT DOCUMENTS

| | | | |
|---|---|---|---|
| 2,731,571 | 1/1956 | Chance | 307/551 |
| 3,193,759 | 7/1965 | Bogdan, Jr. et al. | 307/565 |
| 3,221,186 | 11/1965 | MacDonald et al. | 307/565 |
| 3,305,731 | 2/1967 | Welsh | 307/565 |
| 3,916,221 | 10/1975 | Boyer | 307/590 |
| 4,103,242 | 7/1978 | Shigota | 328/127 |

*Primary Examiner*—Stanley D. Miller
*Assistant Examiner*—B. P. Davis
*Attorney, Agent, or Firm*—Louis Etlinger; Richard I. Seligman

[57] ABSTRACT

A low-loss, low-cost passive pulse width to voltage converter is provided by utilizing a diode clamp having a resistor in series therewith to provide a soft clamp or integrating clamp.

8 Claims, 4 Drawing Figures

4,585,960

PULSE WIDTH TO VOLTAGE CONVERTER CIRCUIT

BACKGROUND OF THE INVENTION

This invention relates to pulse width measuring circuits and more particularly to a circuit for producing an analog voltage proportional to the pulse width of an input pulse train.

There are many requirements to measure the pulse width of pulses of a pulse train. For example, U.S. patent application Ser. No. 659,807, filed concurrently herewith, discloses a low cost pulsed radar altimeter for determining when an object has reached a predetermined altitude. This altimeter utilizes a single oscillator which serves as a transmitter and a superregenerative receiver and indicates the predetermined altitude by denoting when the pulses from the oscillator increase in width. Applicants of that application found that rather than measuring pulse width directly they instead measured the duty factor of the pulse train from the superregenerative receiver. The duty factor of a pulse train is precisely related to pulse width when the pulse repetition frequency and amplitude are constant.

For measuring moderate duty factors a simple lowpass filter can be used. Its output is the average voltage, which is the product of pulse amplitude and duty factor. However, for the low duty factors typically employed in radars (0.001 or less), such a circuit has a very low output.

Assuming a TTL waveform with an amplitude of four volts and a duty factor of 0.001, the output of a lowpass filter will be four millivolts. If it is desired to detect a one percent change in duty factor, that would be forty microvolts. Typical comparators have on the order of one millivolt drift and d.c. amplifiers are no better. Therefore, one might be required to use something like a chopper stabilized amplifier at great expense.

Accordingly, it is an object of this invention to provide an improved duty factor measuring circuit.

It is another object of this invention to provide a circuit for converting pulse width to an analog voltage.

It is further object of this invention to provide a simple, low cost, passive circuit for producing an analog voltage proportional to the duty factor of an input pulse train.

It is yet another object of this invention to provide a low-loss, duty factor measuring circuit.

SUMMARY OF THE INVENTION

Briefly, a pulse width to voltage conversion circuit is provided by using a diode which clamps the tip of pulses applied thereto to ground. By adding series resistance to the diode the clamp is made soft so that a portion of the pulses will extend below ground. The soft clamp integrates for the pulse duration if the product of the series resistance and series capacitance (time constant) is greater than the pulse width. The output from the circuit is lowpass filtered and the resulting d.c. output voltage will change proportionately with small changes in duty factor or pulse width.

BRIEF DESCRIPTION OF THE DRAWINGS

The above-mentioned and other features and objects of this invention will become more apparent by reference to the following description taken in conjunction with the accompanying drawings, in which.

DESCRIPTION OF PREFERRED EMBODIMENTS

Figure 1:
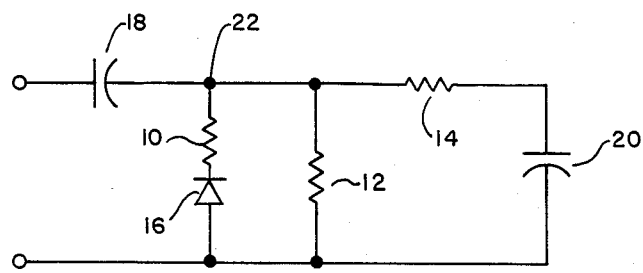
FIG. 1 is a schematic of an embodiment of a pulse width to voltage converter circuit.
Figure 2:
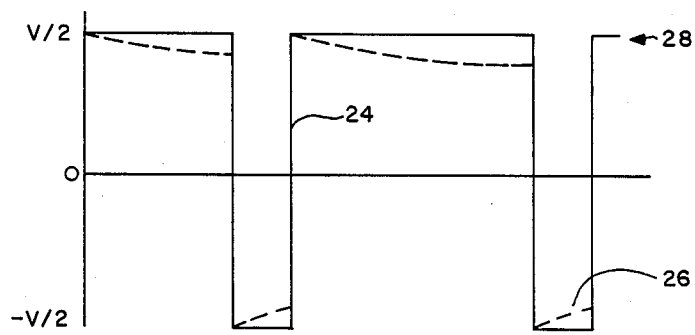
FIG. 2 is an illustration of a waveform generated in the circuit of FIG. 1.

Referring now to FIG. 1 of the drawings, there is illustrated thereby a schematic of a first embodiment of a pulse width to voltage converter circuit. This embodiment includes three resistors 10, 12, and 14, a diode 16 and a pair of capacitors 18 and 20. The left-hand portion of the circuit is like a clamp which has been spoiled by the addition of series resistor 10. It can be called a soft clamp or an integrating clamp. As a result of the series resistor 10, the tip of the pulse applied to the circuit will not be clamped to ground, but instead half of the pulse amplitude is allowed to extend below ground. The idealized waveform at point 22 of the circuit is illustrated in FIG. 2 of the drawings by the solid line 24.

During the interval between pulses of the pulse train applied to the circuit of FIG. 1, capacitor 18 discharges slightly through resistor 12, and when a pulse is applied to the circuit it is recharged. This is illustrated by the dashed lines 26 in FIG. 2. The droop is minimized by making the RC combination of elements 10 and 18 much greater than the pulse width. If the ratio of the values of resistor 10 to resistor 12 (resistor 10/resistor 12) is made equal to the nominal duty factor of the applied pulse train, the positive and negative excursions of the waveform of FIG. 2 are made equal. This is the condition for maximum sensitivity. Note that in selecting the value for resistor 10, allowance should be made for source resistance and diode resistance. That is, resistor 10 should be decreased in value by an amount equal to the source resistance and the resistance of diode 16.

The attenuation factor of this circuit is 0.25. That is, a one percent (1%) change in duty factor will produce an output voltage change that is one quarter percent (0.25%) of the input voltage but it is one half percent (0.5%) of the average output voltage. Using the example set forth earlier, the output change would be ten millivolts instead of forty microvolts.

Resistor 14 and capacitor 20 provide a ripple filter to eliminate all but the average d.c. level 28 which will vary in proportion to change in pulse width. For some applications this ripple filter can be deleted since certain circuits will provide their own lowpass filtering function, for example, if point 22 was connected to a meter.

Figure 3:
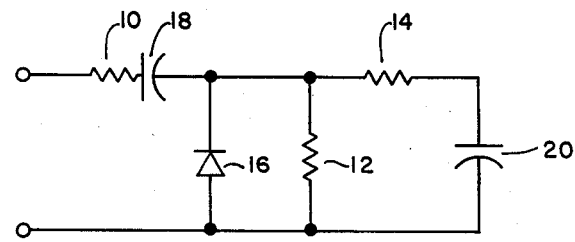
FIG. 3 is a schematic of another embodiment of a pulse width to voltage converter circuit.
Figure 4:
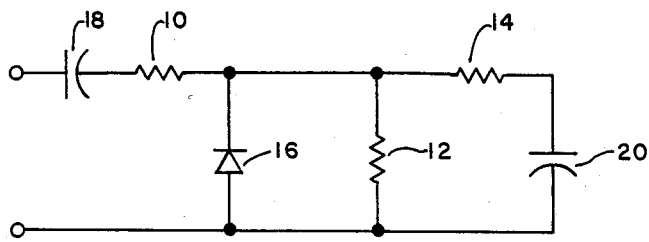
FIG. 4 is a schematic of a further embodiment of a pulse width to voltage converter circuit.

FIGS. 3 and 4 are alternate embodiments to that of FIG. 1 and operate in the same fashion. The only difference in these embodiments is the placement of the resistor 10.

Although the invention has been described in its use as a duty factor measuring circuit, it can be used for other purposes. As mentioned above, the circuit can measure duty factor when the PRF and amplitude of the pulse train are constant; however, when the pulse width and amplitude are constant, the PRF can be meaasured.

While I have desciibed the principles of my invention in conjunction with specific apparatus, it is to be clearly understood that this description is made only by way of example and not as a limitation of the scope of my invention as set forth in the accompanying claims.

I claim:

1. A pulse width to voltage converter circuit, comprising:
   first and second input terminals;
   a capacitor coupled at one side thereof to said first input terminal;
   a first resistance element coupled at one side thereof to the other side of said capacitor;
   a diode coupled between the other side of said resistance element and said second input terminal; and
   a second resistance element coupled across said first resistance element and said diode, wherein the ration of said first resistance element to said second resistance element is approximately equal to the nominal duty factor of the signals to be applied to the circuit.

2. A pulse width to voltage converter circuit as defined in claim 1, further including a lowpass filter coupled to said second resistance element.

3. A pulse width to voltage converter circuit, comprising:
   first and second input terminals;
   a first resistance element coupled at one side thereof to said first input terminal;
   a capacitor coupled at one side thereof to the other side of said first resistance element;
   a diode coupled between the other side of said capacitor and said second input terminal; and
   a second resistance element coupled across said diode, wherein the ratio of said first resistance element to said second resistance element is approximately equal to the nomimal duty factor of the signals to be applied to the circuit.

4. A pulse width to voltage converter as defined in claim 3, further including a lowpass filter coupled to said second resistance element.

5. A pulse width to voltage converter circuit, comprising:
   first and second input terminals;
   a capacitor coupled at one side thereof to said first input terminal;
   a first resistance element coupled at one side thereof to the other side of said capacitor;
   a diode coupled between the other side of said first resistance element and said second input terminal; and
   a second resistance element coupled across said diode, wherein the ratio of said first resistance element to said second resistance element is approximately equal to the nominal duty factor of the signals to be applied to the circuit.

6. A pulse width to voltage converter circuit as defined in claim 5, further including a lowpass filter coupled to said second resistance element.

7. A pulse width to voltage converter circuit as defined in claims 1, 3 or 5, wherein the time constant of said first resistance element and said capacitor is very much greater than the nominal pulse width of the signals to be applied to the circuit.

8. A pulse width to voltage converter circuit as defined in claims 1, 3 or 5, wherein the value of said first resistance element is decreased by an amount equal to the resistance of said diode and the resistance of any source coupled to the circuit.

* * * * *